(12) United States Patent
Gilliland (10) Patent No.: US 10,546,645 B1
(45) Date of Patent: Jan. 28, 2020

(54) NON-VOLATILE MEMORY WITH SINGLE ENDED READ SCHEME USING DISTRIBUTED COMMON MODE FEEDBACK

(71) Applicant: Synopsys, Inc., Mountain View, CA (US)

(72) Inventor: Troy Nathan Gilliland, Bellevue, WA (US)

(73) Assignee: Synopsys, Inc., Mountain View, CA (US)

( * ) Notice: Subject to any disclaimer, the term of this patent is extended or adjusted under 35 U.S.C. 154(b) by 13 days.

(21) Appl. No.: 16/034,294

(22) Filed: Jul. 12, 2018

Related U.S. Application Data

(60) Provisional application No. 62/532,702, filed on Jul. 14, 2017.

(51) Int. Cl.
*G11C 7/04* (2006.01)
*G11C 8/18* (2006.01)
*G11C 16/26* (2006.01)
*G11C 16/24* (2006.01)
*G11C 16/04* (2006.01)

(52) U.S. Cl.
CPC .......... *G11C 16/26* (2013.01); *G11C 16/0408* (2013.01); *G11C 16/24* (2013.01)

(58) Field of Classification Search
CPC . G11C 11/5642; G11C 16/0475; G11C 16/28; G11C 16/26; G11C 11/22; G11C 16/24; G11C 7/14; G11C 11/00; G11C 11/16; G11C 16/16; G11C 5/02; G11C 7/04; G11C 8/18

See application file for complete search history.

(56) References Cited

U.S. PATENT DOCUMENTS

8,570,819 B2  10/2013  McCollum et al.
9,042,183 B2   5/2015  Kamata et al.
9,190,156 B2  11/2015  Sako
(Continued)

*Primary Examiner* — Hien N Nguyen
(74) *Attorney, Agent, or Firm* — Fenwick & West LLP (57) ABSTRACT

A non-volatile memory system includes an array of bit cells arranged in rows and columns and configured to store bits of data, a reference bit cell, a plurality of bit lines connectable to the bit cells in the array and connecting to the reference bit cell, and a bit line controller. The bit line controller comprises a plurality of sense amps connected to the bit cells by the bit lines. The bit line controller determines the contents of the bit cells based on times $t_{cell}$ compared to a time $t_{ref}$, where $t_{cell}$ is the time required for a current $I_{cell}$ generated by one of the bit cells to raise a voltage $V_{sense}$ of one of the sense amps by an amount $\Delta V$, and $t_{ref}$ is the time required for a current $I_{ref}$ generated by the reference bit cell to raise the voltage $V_{sense}$ of another one of the sense amps by the same $\Delta V$. $\Delta V$ increases monotonically as a function of $I_{ref}$.

20 Claims, 6 Drawing Sheets

(56) References Cited

U.S. PATENT DOCUMENTS

| | | |
|---|---|---|
| 9,761,318 B1 * | 9/2017 | Kondo .................. G11C 16/08 |
| 9,830,961 B2 | 11/2017 | Takekida |
| 10,049,713 B2 * | 8/2018 | Di Vincenzo ....... G11C 11/2275 |
| 10,056,129 B1 * | 8/2018 | Sakurai ............... G11C 11/2257 |
| 2014/0325118 A1 * | 10/2014 | Cheng ................ G06F 12/0246 |
| | | 711/103 |
| 2018/0091170 A1 * | 3/2018 | Asami ................ H03M 13/1111 |

* cited by examiner

NON-VOLATILE MEMORY WITH SINGLE ENDED READ SCHEME USING DISTRIBUTED COMMON MODE FEEDBACK

CROSS-REFERENCE TO RELATED APPLICATION(S)

This application claims priority under 35 U.S.C. § 119(e) to U.S. Provisional Patent Application Ser. No. 62/532,702, "Non-Volatile Memory With Single Ended Read Scheme using Distributed Common Mode Feedback," filed Jul. 14, 2017.

BACKGROUND

1. Field of Art

The disclosure generally relates to electronic circuit design, and more specifically to configurations for efficient memory circuits and operations.

2. Description of the Related Art

Memory devices are electronic devices arranged to store data. Among various types of memory devices, demand for embedded nonvolatile memory (NVM) in integrated circuits has increased recently, because NVM can retain data even when power is inactivated. Desirable characteristics of embedded NVM include low cost, low power, high speed, and high reliability (data retention and program/erase cycling endurance).

Two approaches to reading data are single-ended and differential. Single ended read systems offer many advantages in terms of area, power and speed but are often much less accurate (sometimes to the point of not being useable) or have a more limited range of operation, than their differential ended counterparts.

Therefore, there is a need for improved read operation for single-ended NVM.

SUMMARY

A non-volatile memory system includes an array of bit cells arranged in rows and columns and configured to store bits of data, a reference bit cell, a plurality of bit lines connectable to the bit cells in the array and connecting to the reference bit cell, and a bit line controller. The bit line controller comprises a plurality of sense amps connected to the bit cells by the bit lines. The bit line controller determines the contents of the bit cells based on times $t_{cell}$ compared to a time $t_{ref}$, where $t_{cell}$ is the time required for a current $I_{cell}$ generated by one of the bit cells to raise a voltage $V_{sense}$ of one of the sense amps by an amount $\Delta V$, and $t_{ref}$ is the time required for a current $I_{ref}$ generated by the reference bit cell to raise the voltage $V_{sense}$ of another one of the sense amps by the same $\Delta V$. $\Delta V$ increases monotonically as a function of $I_{ref}$.

Other aspects include components, circuits, devices, systems, improvements, methods, processes, applications, computer readable mediums, and other technologies related to any of the above.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Figure 1:
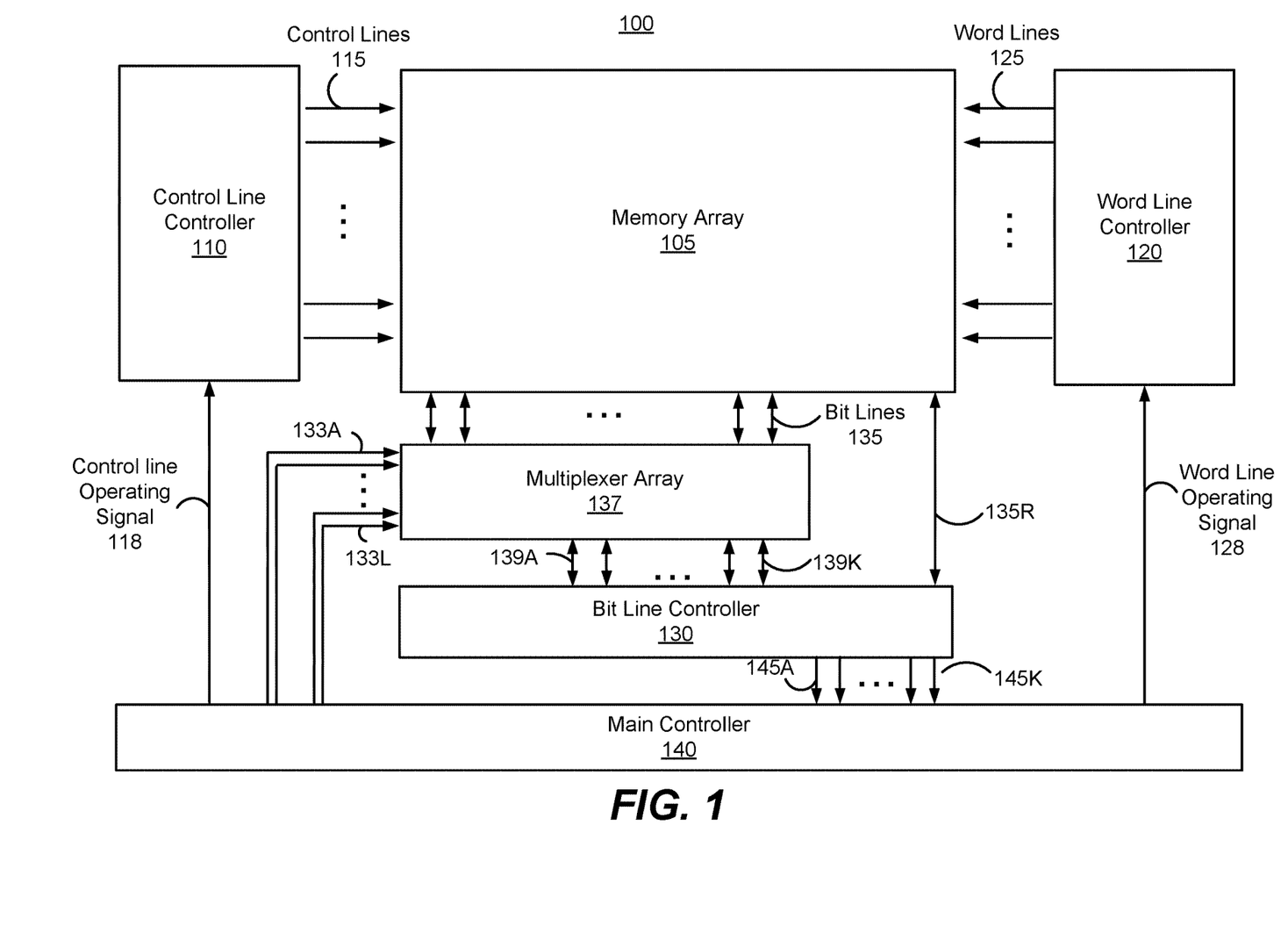
FIG. 1 illustrates one embodiment of a non-volatile memory system.

FIG. 1 is a block diagram illustrating a memory system 100, according to one embodiment. The memory system 100 includes a non-volatile memory (NVM) array (or memory array) 105, a control line controller 110, a word line controller 120, a bit line controller 130, and a main controller 140. The memory array 105 includes a plurality of bit cells 140 to store data. In one implementation, a multiplexer array 137 is coupled between the bit line controller 130 and the memory array 105. Preferably, the memory system 100 is implemented in an integrated circuit. Together, these components perform data read and write operations on the memory array 105.

The main controller 140 coordinates the operation of the control line controller 110, the word line controller 120, and the bit line controller 130 for performing the data write operation and the data read operation. One aspect of performing the data read/write operation involves selecting a bit cell from the plurality of bit cells in the memory array 105 and providing appropriate voltages to bit cells according to the selection of the bit cell. A selected bit cell to perform the data read/write operation is determined by coordinating the selections from the control line controller 110, the word line controller 120, and the bit line controller 130. In one aspect, the bit cell is selected by matching selections from the control line controller 110, the word line controller 120, and the bit line controller 130. Hence, the main controller 140 operates the control line controller 110, the word line controller 120, and the bit line controller 130 to select a selected bit cell from a plurality of bit cells in the memory array 105.

In one approach, the control line controller 110 selects bit cells from the plurality of bit cells in one direction (herein referred to as a "row direction"), depending on the operation of the memory system 100. The main controller 140 provides a control line operating signal 118 to the control line controller 110 for selecting a control line 115 coupled to bit cells in the row. According to the control line operating signal 118, the control line controller 110 applies appropriate voltages to control lines 115 for performing the data read/write operation.

In one approach, the word line controller 120 selects bit cells from the plurality of bit cells in the row direction. The main controller 140 provides a word line operating signal 128 to the word line controller 120 for selecting a word line 125 associated with the selected control line 115 to provide power to the bit cells coupled to the selected word line 125. In one approach, the selected word line 125 is coupled to a portion of bit cells coupled to the selected control line 115 in the row. In one example, the word line controller 120 selects a word line 125 that is coupled to 1024 bit cells in a row coupled to a selected control line 115. Alternatively, a selection of the word line 125 is omitted, and all word lines 125 are supplied with the same voltage level. According to the word line operating signal 128, the word line controller 120 applies appropriate voltages to word lines 125.

The bit line controller 130 senses data stored in bit cells in another direction (herein referred to as a "column direction"). The main controller 140 controls the bit line controller 130 for sensing a selected bit cell from the bit cells in a row selected by the control line controller 110. The main controller 140 receives the sensed data 145A, 145B . . . 145K from the bit line controller 130. The bit line controller 130 typically includes sense amps and latches, as will be described below. For purposes of clarity in explaining the read operation, circuitry and functions relating to writing (programming) and erasing data are generally omitted.

In one implementation, the multiplexer array 137 is structured between the memory array 105 and the bit line controller 130 for multiplexing the bit lines 135. The multiplexer array 137 is coupled to the bit line controller 130 through multiplexed bit lines 139A, 139B . . . 139K (generally herein referred to as a "multiplexed bit line 139"). In addition, the multiplexer array 137 is coupled to the memory array 105 through bit lines 135. In one aspect, the multiplexer array 137 includes a number, e.g., L (L comprising an integer value), of multiplexers, and each multiplexer is controlled by a corresponding bit select signals 133A, 133B . . . 133L (generally herein referred to as a "bit select signal 133") (A comprising a first integer value and L and some last (or outer) integer value) from the main controller 140 respectively. Each multiplexer is coupled to its corresponding multiplexed bit line 139 and a group of bit lines 135 coupled to the selected word line 125. Bit line 135R is for a reference bit cell, as described below.

Figure 2:
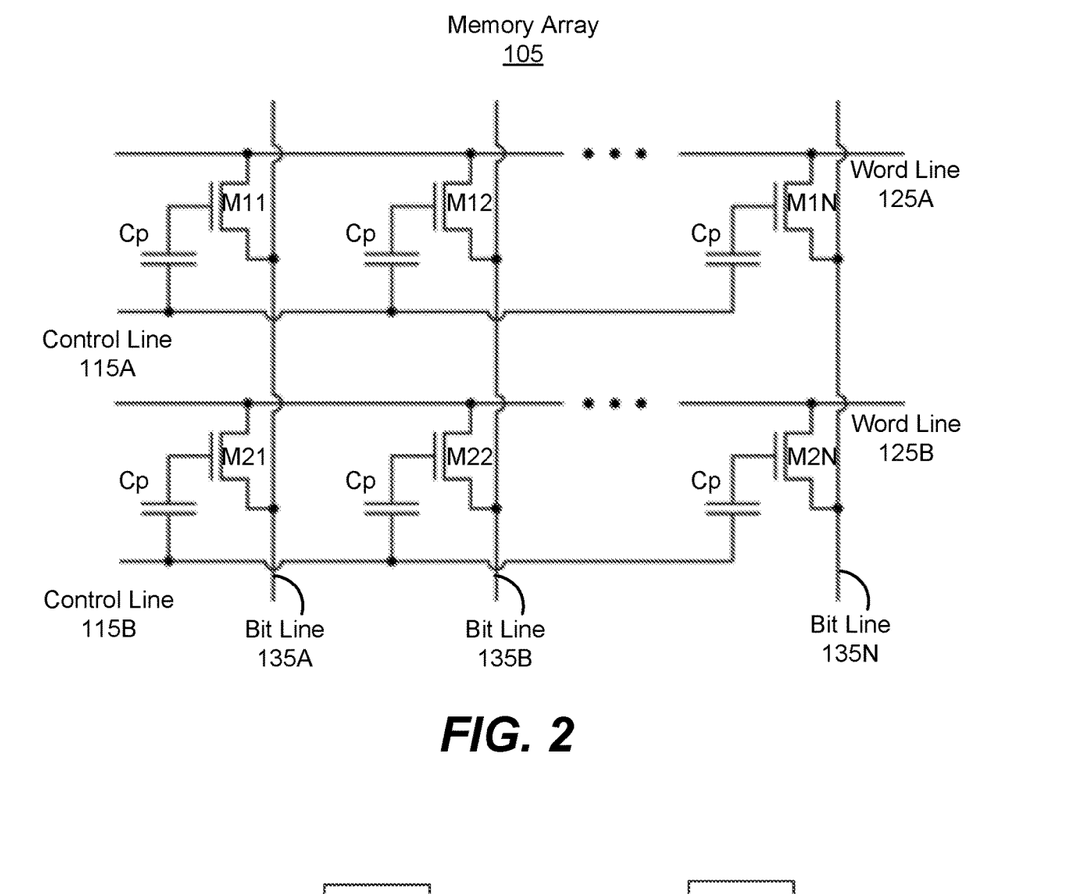
FIG. 2 illustrates one implementation of a non-volatile memory array of the memory system.

FIG. 2 illustrates one example embodiment of a portion of the non-volatile memory array 105 of the memory system 100. The memory array 105 includes bit cells formed by transistors M11, M12 . . . M2N, control lines 115A, 115B (herein referred to as a "control line 115"), word lines 125A, 125B (herein referred to as a "word line 125"), and bit lines 135A, 135B . . . 135N (herein referred to as a "bit line 135") (A comprising a first integer value and N comprising some outer integer value). In one implementation, each bit cell includes a transistor coupled to a control line 115, word line 125, and bit line 135. Preferably, the transistor is an n-channel MOSFET (herein referred to as an "NMOS transistor"), where a gate terminal is coupled to the control line 115, a drain terminal is coupled to the word line 125, and the source terminal is coupled to the bit line 135. For a nonvolatile memory, each bit cell may also include a capacitor Cp coupled between the floating gate and the control line 115. Based on voltages applied or biased to the bit cells through the control lines 115, word lines 125, and bit lines 135, charges may be stored on floating gates, or removed to reset the bit cells.

In one aspect, an NMOS transistor in the bit cell is enhanced with a drain junction having dopant concentrations in the lightly-doped-drain (LDD) region. As a result, higher channel-hot-electron-injection (CHEI) efficiency is achieved to deposit electron charges on the floating gates to represent a programmed state.

In one approach, one logical state of a bit cell is represented by storing (i.e., programming) charges on floating gate of the bit cell, and another logical state of the bit cell is represented by removing (i.e., erasing) charges on the floating gate of the bit cell. To erase a bit cell (e.g., set it to logic 0), charges on the floating gate of a transistor in the bit cell are removed such that the gate voltage (i.e., voltage at the gate terminal of a transistor) is higher than a reference voltage and within a certain voltage range. Conversely, to program a bit cell (e.g., set it to logic 1), charges on the floating gate of the bit cell are deposited such that the gate voltage is lower than the reference voltage and within another certain voltage range. For example, FN tunneling effect may be used to erase bit cells and channel hot electron injection effect may be used to program bit cells by applying high voltages or high currents to the NMOS transistors properly.

As described with respect to FIG. 1, the main controller 140 coordinates the operation of the memory array 105 by controlling the control line controller 110, the word line controller 120, and the bit line controller 130 through the control line operating signal 118, the word line operating signal 128, respectively.

Figure 3:
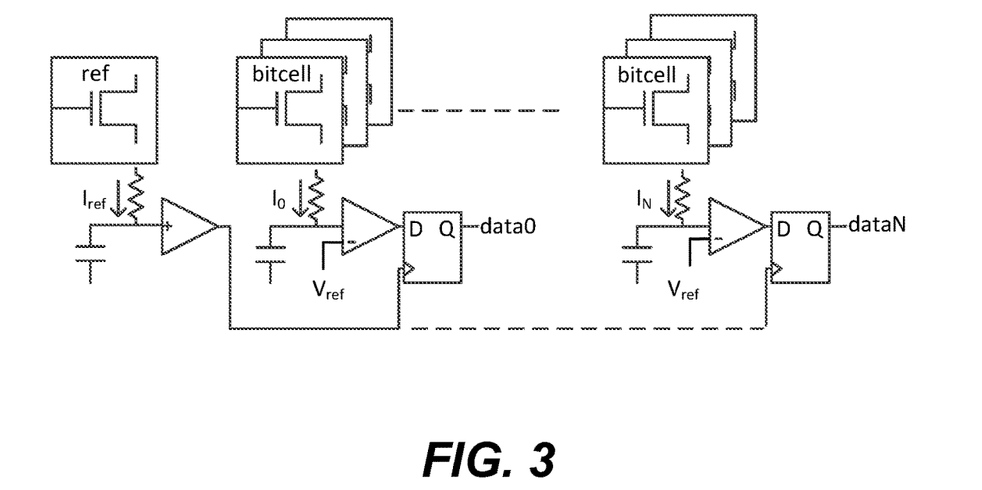
FIG. 3 illustrates one implementation of a bit line controller of the memory system.

FIG. 3 illustrates one implementation of a bit line controller of the memory system. During read operation, each bit cell produces a current $I_0$-$I_N$, generally referred to as $I_{cell}$. A reference bit cell also produces a reference current $I_{ref}$. Depending on whether $I_{cell}$ is larger or smaller than $I_{ref}$ determines whether the content (data0-dataN) is read as a 0 or 1. In one approach, this is determined based on the time required for the current to raise the voltage of a certain node by a certain amount $\Delta V$. The bit cell current $I_{cell}$ requires a time teen to raise the voltage by $\Delta V$, and the reference current $I_{ref}$ requires a time $t_{ref}$ to raise the voltage by $\Delta V$. Depending on whether $t_{cell}$ is shorter or longer than $t_{ref}$ determines whether the content (data0-dataN) is read as a 0 or 1. In FIG. 3, this determination is made by using a voltage based on $I_{ref}$ to clock data into a latch. If $I_{cell}$ is large, then the input voltage to the latch will exceed the 0/1 threshold by the time the latch is triggered, and the data will be latched as a 1. If $I_{cell}$ is small, the data will be latched as a 0.

In FIG. 3, $\Delta V$ is a function of $I_{ref}$. For larger values of $I_{ref}$, $\Delta V$ will also be larger. $I_{ref}$ may change over the lifetime of the NVM, or simply due to manufacturing variations.

Figure 4:
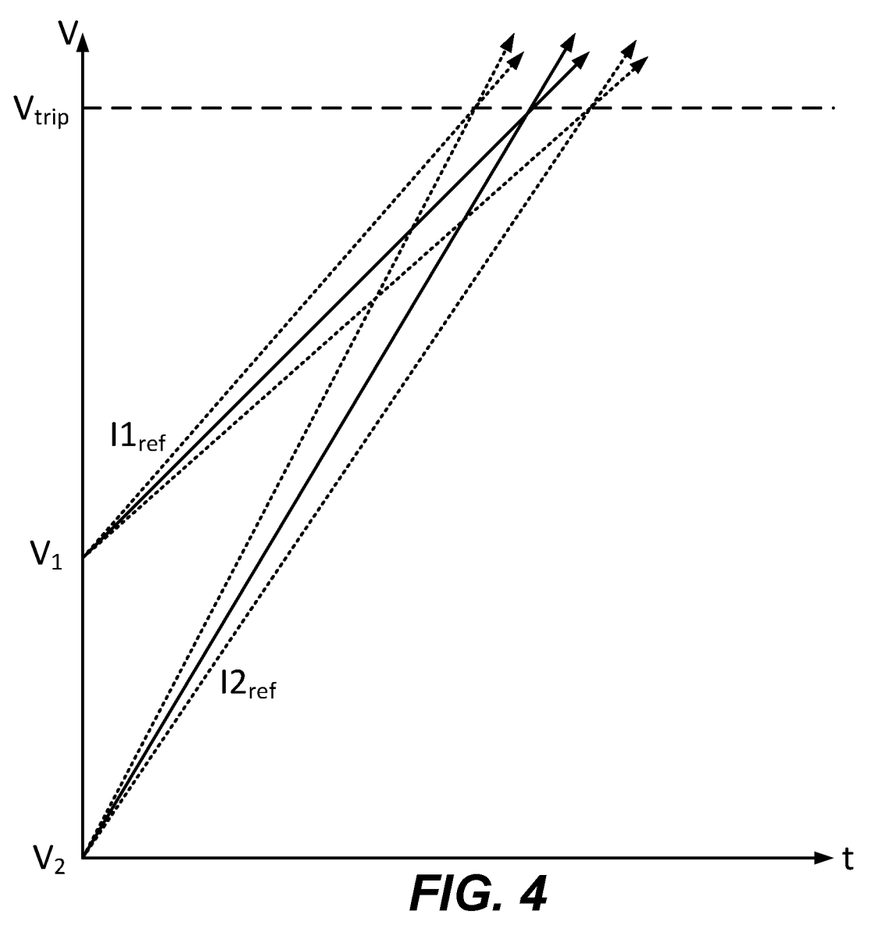
FIG. 4 illustrates operation of one implementation of a bit line controller.

FIG. 4 illustrates one example of this. FIG. 4 shows two different values of $I_{ref}$, labelled $I1_{ref}$ and $I2_{ref}$. The solid line show the voltage increase as a function of time. The dashed lines to either side of the solid line shows currents that are larger or smaller than $I_{ref}$ which represent data bits of 1 and 0. $V_{trip}$ is a threshold voltage distinguishing 1 and 0. In the case of the slower charging current $I1_{ref}$, the starting voltage $V_1$ is higher so $\Delta V = V_{trip} - V_1$ is less. Accordingly, the time required to read a data 1 or 0 is the same for both values of $I_{ref}$.

Figure 5A:
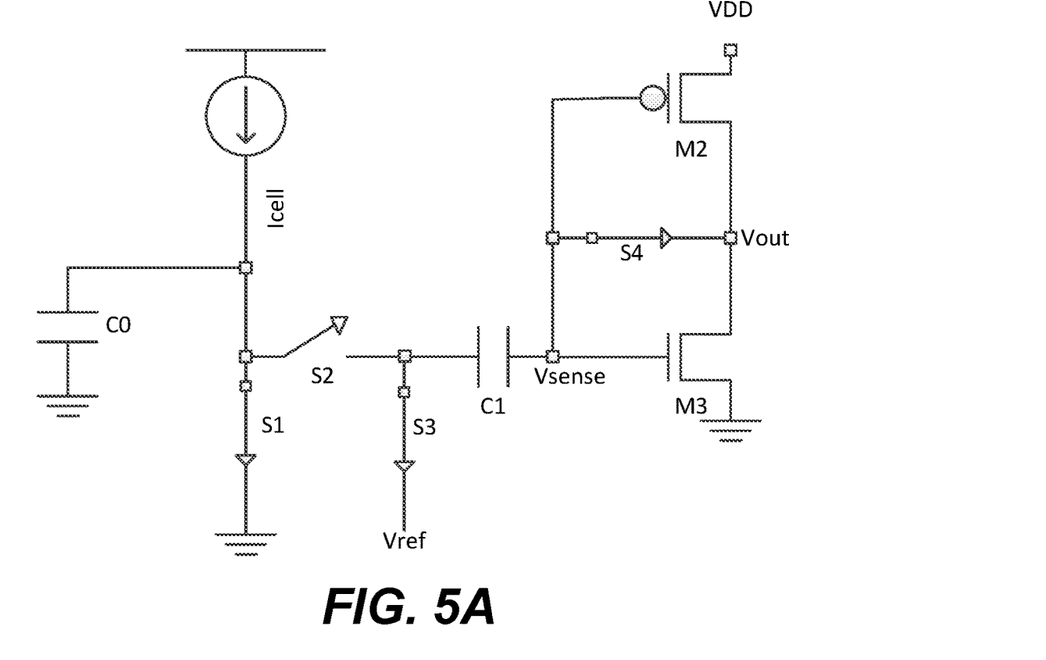
FIGS. 5A-5B illustrate one embodiment of a circuit implementation of a sense amp.
Figure 5B:
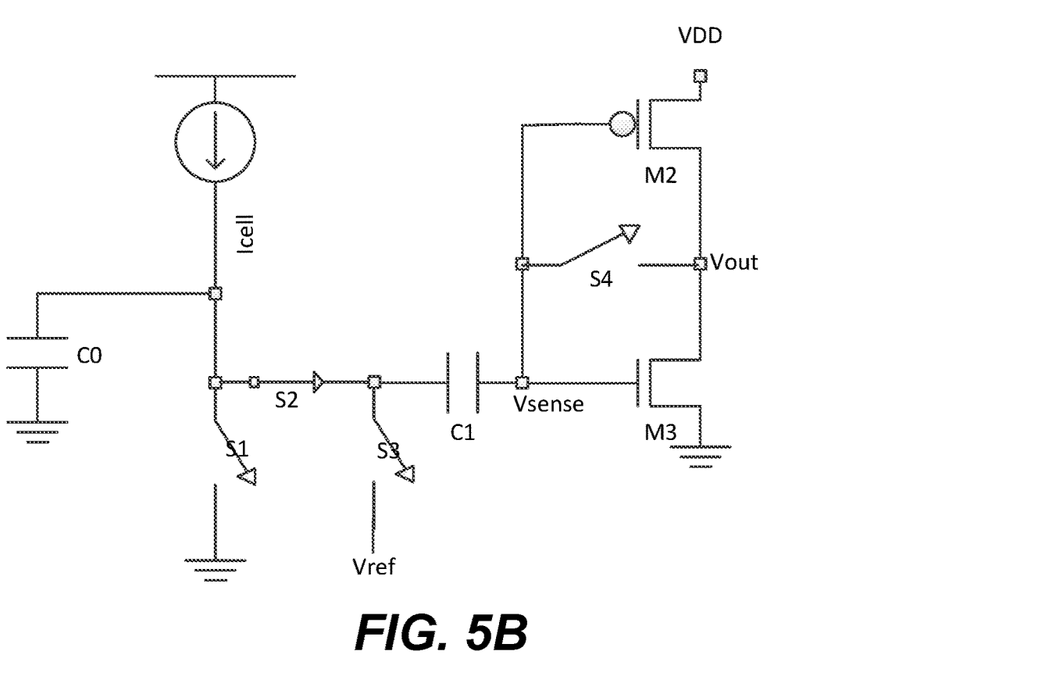

FIGS. 5A-5B illustrate one embodiment of a circuit implementation of a sense amp. Assume that $V_{dd}=2V$, and $V_{sense}$ has a threshold voltage or trip voltage $V_{trip}=1V$. Assume that $V_{ref}$, which is a reference voltage based on $I_{ref}$, is 100 mV. In FIG. 5A, capacitor C0 will be grounded, the left side of capacitor C1 will be at $V_{ref}=100$ mV and the right side of capacitor C1 will be at $V_{sense}=V_{trip}=1V$. The voltage across C1 is 900 mV. In FIG. 5B, the left side of capacitor C1 is pulled down to ground by C0, the voltage across C1 is 900 mV, so $V_{sense}=900$ mV. $\Delta V=100$ mV and $I_{cell}$ starts to charge C1.

Now assume $V_{ref}=600$ mV, then in FIG. 5B, the left side of capacitor C1 is pulled down to ground by C0, the voltage across C1 is 400 mV, so $V_{sense}=400$ mV. $\Delta V=600$ mV and $I_{cell}$ (which is larger in this case) starts to charge C1.

Sampling the reference value $V_{ref}$ in this way provides feedback about $I_{ref}$ to each sense amp. This feedback is provided to each sense amp, so it is a form of distributed common mode feedback. Each sense amp adjusts $\Delta V$ as a function of the reference level $I_{ref}$, which can vary over PVT (process, voltage, temperature) and also over time. For smaller $I_{ref}$, $V_{ref}$ is lower so $\Delta V$ is also lower. For larger $I_{ref}$, $V_{ref}$ is higher so $\Delta V$ is also higher. This in turn reduces variability in the read speed (i.e., time for each sense amp to make a decision) and allows for an increased range of operation compared to a single-ended sense amp without this feedback. In this sense, the system may be described as a pseudo differential system, in that it provides some of the performance improvements characteristic of a traditional fully differential system but without the area/time overhead required to implement an actual fully differential system.

Figure 6A:
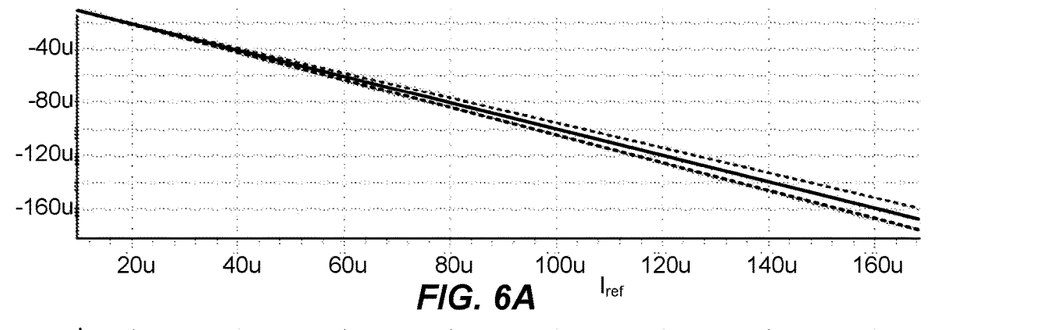
FIG. 6A-6D illustrate results from a simulation of a non-volatile memory system, according to one embodiment.
Figure 6B:
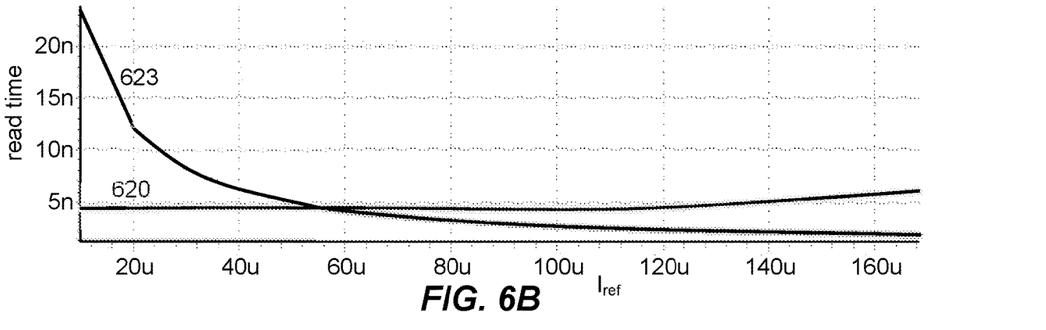
Figure 6C:
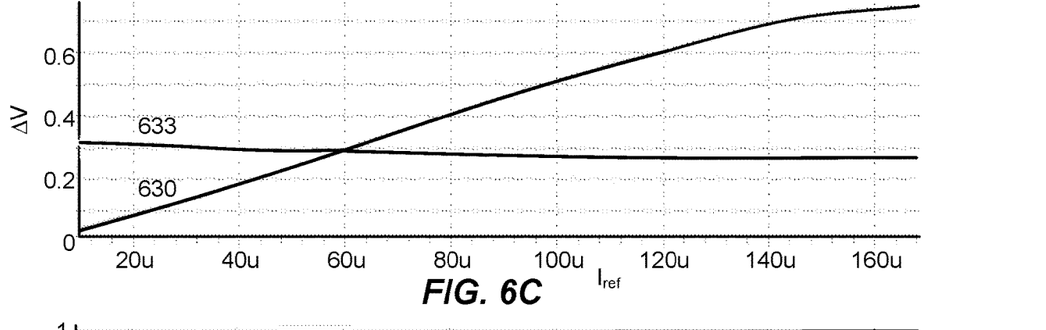
Figure 6D:
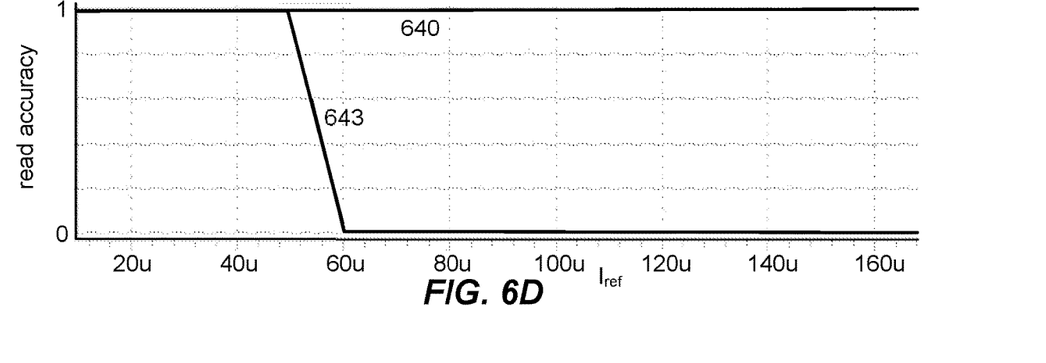

FIGS. 6A-6D show example simulation results. In all of these plots, the x-axis is $I_{ref}$ in μA. FIG. 6A plots $I_{ref}$ as the solid line, and I0 (current that represents a data 0) and I1 (current that represents a data 1) as the two dashed lines. FIG. 6B plots read time. Curve 620 is the system described where $\Delta V$ varies as a function of $I_{ref}$. Curve 623 is a conventional case where $\Delta V$ is constant. FIG. 6C plots $\Delta V$. Curve 630 is for the current system and curve 633 is for the conventional system. FIG. 6D plots read accuracy, where 1 means a correct read and 0 means an error. Curve 640 is for the current system and curve 643 is for the conventional system.

Figure 7:
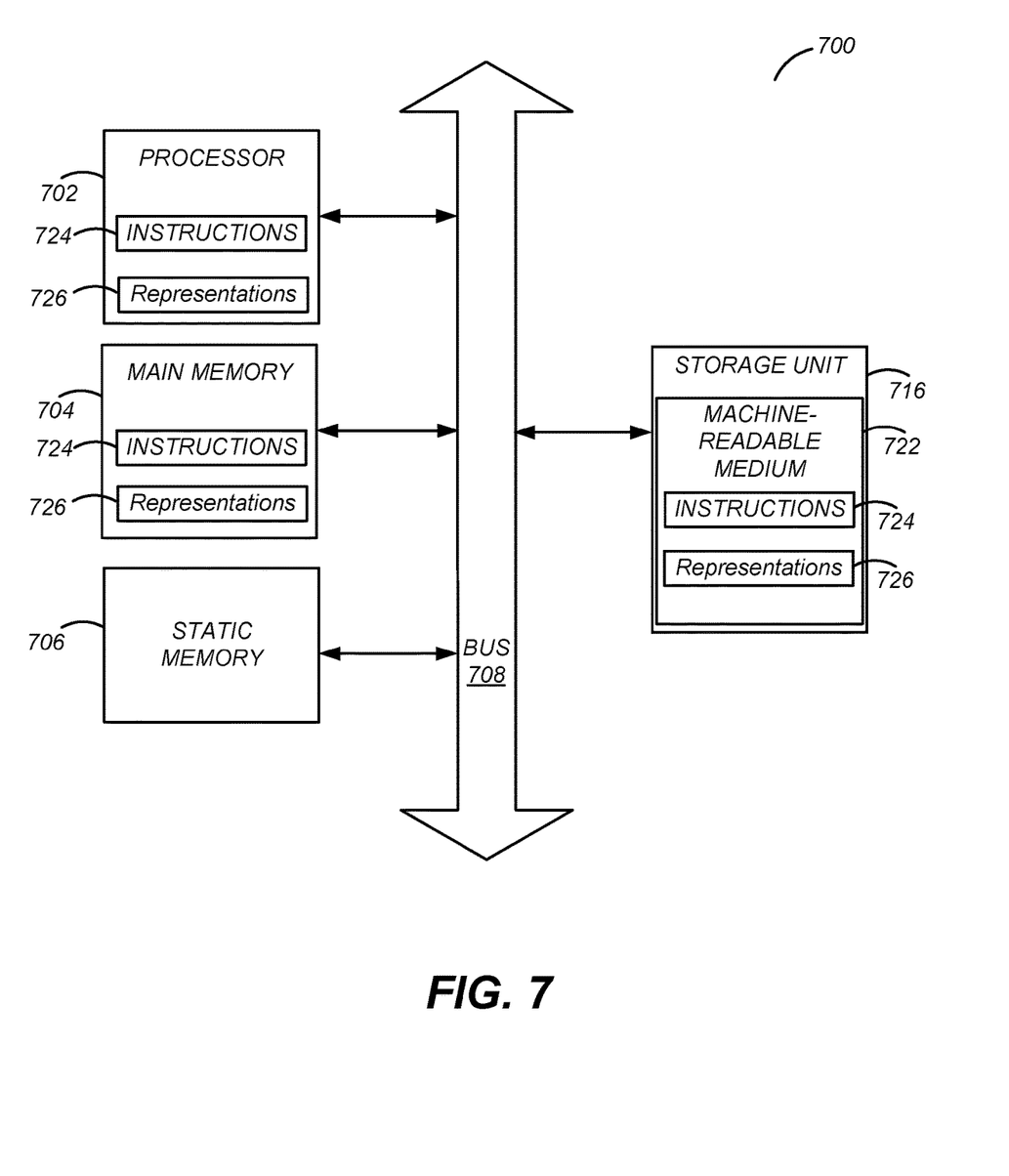
FIG. 7 illustrates one embodiment of components of an example machine able to read instructions or representations from a machine-readable medium and execute them in a processor (or controller).

FIG. 7 is a block diagram illustrating components of an example machine able to read instructions from a machine-readable medium and execute them in a processor (or controller). Specifically, FIG. 7 shows a diagrammatic representation of a machine in the example form of a computer system 700 within which instructions 724 (e.g., software) for causing the machine to perform any one or more of the methodologies discussed herein may be executed. For example, the computer system 700 stores representations 726 of the memory system 100 disclosed above to be used in a process of integrated circuit design. In alternative embodiments, the machine operates as a standalone device or may be connected (e.g., networked) to other machines. In a networked deployment, the machine may operate in the capacity of a server machine or a client machine in a server-client network environment, or as a peer machine in a peer-to-peer (or distributed) network environment.

The machine may be a server computer, a client computer, a personal computer (PC), or any machine capable of executing instructions 724 (sequential or otherwise) that specify actions to be taken by that machine. Further, while only a single machine is illustrated, the term "machine" shall also be taken to include any collection of machines that individually or jointly execute instructions 724 to perform any one or more of the methodologies discussed herein.

The example computer system 700 includes a processor 702 (e.g., a central processing unit (CPU), a graphics processing unit (GPU), a digital signal processor (DSP), one or more application specific integrated circuits (ASICs), a main memory 704, a static memory 706, and a storage unit 716 which are configured to communicate with each other via a bus 708. The storage unit 716 includes a machine-readable medium 722 on which is stored instructions 724 (e.g., software) and/or representations 726 embodying any one or more of the methodologies or functions described herein. The instructions 724 (e.g., software) and the representations 726 may also reside, completely or at least partially, within the main memory 704 or within the processor 702 (e.g., within a processor's cache memory) during execution thereof by the computer system 700, the main memory 704 and the processor 702 also constituting machine-readable media.

In one implementation, the representations 726 of the disclosed memory system 100 are stored in a computer readable medium 722 (storage) and employed in electronic design automation (EDA) software in the process of design of integrated circuits and systems. In one aspect, a pre-populated representation 726 of the memory system 100 disclosed herein is stored in a computer readable medium 722 (storage) in VHDL or Verilog code. The pre-populated representation of the memory system 100 may be used in schematic, input netlist or logic level design. Alternatively and additionally, another pre-populated representation 726 of the memory system 100 including physical positioning of circuit elements and routing (connection of the same) such as in GDSII are stored in the computer readable medium 722 (storage). Another pre-populated representation 726 of the memory system 100 may be used in physical layout implementation.

What is claimed is:

1. A non-volatile memory system, comprising:
   an array of bit cells arranged in rows and columns and configured to store bits of data;
   a reference bit cell;
   a plurality of bit lines connectable to the bit cells in the array and connecting to the reference bit cell; and
   a bit line controller comprising a plurality of sense amps connected to the bit cells by the bit lines, the bit line controller determining the contents of the bit cells based on times $t_{cell}$ compared to a time $t_{ref}$, wherein $t_{cell}$ is the time required for a current $I_{cell}$ generated by one of the bit cells to raise a voltage $V_{sense}$ of one of the sense amps by an amount $\Delta V$, and $t_{ref}$ is the time required for a current $I_{ref}$ generated by the reference bit cell to raise the voltage $V_{sense}$ of another one of the sense amps by the same $\Delta V$, wherein $\Delta V$ increases monotonically as a function of $I_{ref}$.

2. The non-volatile memory system of claim 1, wherein $\Delta V$ increases linearly as a function of $I_{ref}$.

3. The non-volatile memory system of claim 1, wherein $t_{cell}$ is the time required to raise the voltage $V_{sense}$ from a starting voltage to a trip voltage $V_{trip}$ that is constant with respect to $I_{ref}$.

4. The non-volatile memory system of claim 3, wherein the starting voltage decreases monotonically as a function of $I_{ref}$.

5. The non-volatile memory system of claim 3, wherein $V_{sense}$ is set to the starting voltage during a first phase of operation and the current $I_{cell}$ raises $V_{sense}$ during a second phase of operation.

6. The non-volatile memory system of claim 3, wherein each sense amp includes a capacitor C1 with a first terminal closer to the bit line and a second terminal away from the bit line, and $V_{sense}$ is a voltage on the second terminal of the capacitor C1.

7. The non-volatile memory system of claim 6, wherein:
during a first phase of operation, the first terminal of C1 is disconnected from the bit line and charged to a voltage $V_{ref}$ proportional to $I_{ref}$, and the second terminal of C1 is charged to the trip voltage $V_{trip}$, wherein the starting voltage=$V_{trip}-V_{ref}$ and $\Delta V=V_{ref}$; and
during a second phase of operation, the first terminal of C1 is disconnected from the voltage $V_{ref}$, connected to the bit line and initially pulled down to ground, whereby the second terminal of C1 is initially pulled down to $V_{sense}=V_{trip}-V_{ref}$ and $V_{sense}$ increases as the first terminal of C1 is charged by the current $I_{cell}$.

8. The non-volatile memory system of claim 3, wherein the bit line controller further comprises:
a plurality of latches having a data input, a clock input and a data output, wherein the data input receives an output of the sense amp for one of the bit cells and the clock input receives an output of the sense amp for the reference bit cell.

9. The non-volatile memory system of claim 1, wherein $t_{ref}$ is constant with respect to $I_{ref}$.

10. The non-volatile memory system of claim 1, wherein the bit line controller is operational for a range of $I_{ref}$ that includes at least 30 μA to 150 μA.

11. The non-volatile memory system of claim 1, wherein the bit line controller is operational for a range of $I_{ref}$ that includes at least 10 μA to 170 μA.

12. The non-volatile memory system of claim 1, wherein, over an operational range of the non-volatile memory system, the percentage variation of $t_{ref}$ is less than half of the percentage variation of $I_{ref}$.

13. The non-volatile memory system of claim 1, wherein the bit line controller correctly determines the contents of the bit cells for $I_{cell}=1.05I_{ref}$ and for $I_{cell}=0.95I_{ref}$.

14. The non-volatile memory system of claim 1, wherein the non-volatile memory is embedded memory in a system-on-chip.

15. The non-volatile memory system of claim 1, wherein the non-volatile memory is fabricated using a standard CMOS process.

16. The non-volatile memory system of claim 1, further comprising:
a plurality of control lines and word lines connectable to the bit cells in the array; wherein the control lines, bit lines and word lines are used to program, erase and read the bit cells.

17. The non-volatile memory system of claim 16, wherein each bit cell comprises a transistor, the control lines coupled to gate terminals of the transistors, the word lines coupled to drain terminals of the transistors, and the bit lines coupled to source terminals of the transistors.

18. The non-volatile memory system of claim 17, wherein each bit cell further comprises a capacitor coupled between the control line and a gate terminal of the transistor, the capacitor storing charges according to the bit stored in the bit cell.

19. The non-volatile memory system of claim 1, further comprising:
a multiplexer array coupled between the bit line controller and the array of bit cells.

20. A computer program product comprising a non-transitory computer readable storage medium storing a representation of a non-volatile memory system comprising:
an array of bit cells arranged in rows and columns and configured to store bits of data;
a reference bit cell;
a plurality of bit lines connectable to the bit cells in the array and connecting to the reference bit cell; and
a bit line controller comprising a plurality of sense amps connected to the bit cells by the bit lines, the bit line controller determining the contents of the bit cells based on times $t_{cell}$ compared to a time $t_{ref}$, wherein $t_{cell}$ is the time required for a current $I_{cell}$ generated by one of the bit cells to raise a voltage $V_{sense}$ of one of the sense amps by an amount $\Delta V$, and $t_{ref}$ is the time required for a current $I_{ref}$ generated by the reference bit cell to raise the voltage $V_{sense}$ of another one of the sense amps by $\Delta V$, wherein $\Delta V$ increases monotonically as a function of $I_{ref}$.

* * * * *